(12) United States Patent
Noguchi et al.

(10) Patent No.: US 9,218,868 B2
(45) Date of Patent: Dec. 22, 2015

(54) MAGNETIC MEMORY

(71) Applicant: Kabushiki Kaisha Toshiba, Minato-ku (JP)

(72) Inventors: Hiroki Noguchi, Yokohama (JP); Keiko Abe, Yokohama (JP); Shinobu Fujita, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 113 days.

(21) Appl. No.: 14/200,425

(22) Filed: Mar. 7, 2014

(65) Prior Publication Data

US 2014/0293685 A1    Oct. 2, 2014

(30) Foreign Application Priority Data

Mar. 26, 2013  (JP) .................. 2013-063764

(51) Int. Cl.
*G11C 7/12* (2006.01)
*G11C 11/16* (2006.01)

(52) U.S. Cl.
CPC .............. *G11C 11/1675* (2013.01); *G11C 7/12* (2013.01); *G11C 11/1673* (2013.01)

(58) Field of Classification Search
CPC ... G11C 11/1675; G11C 7/12; G11C 11/1673
See application file for complete search history.

(56) References Cited

U.S. PATENT DOCUMENTS 7,116,593 B2 * 10/2006 Hanzawa et al. ......... G11C 7/12
                                                257/E27.004
7,593,253 B2  9/2009 Takemura et al.
8,238,132 B2  8/2012 Kitagawa
2010/0259993 A1 10/2010 Kang
2011/0299330 A1 12/2011 Ong

FOREIGN PATENT DOCUMENTS

JP    2007-311514    11/2007
JP    2008-91701      4/2008
JP    2010-140526     6/2010

OTHER PUBLICATIONS

Japanese Office Action issued Nov. 12, 2013, in Japan Patent Application No. 2013-063764 (with English translation).

* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

A magnetic memory according to an embodiment includes: a plurality of memory cells, each memory cell including a first MTJ element and a first selection unit; a pair of a first and second bit lines provided to each column of the memory cells; a word line provided to each row of the memory cells; an equalizer circuit provided to each column of the memory cells, and to connect between the first and second bit lines; and a control circuit that sets the first and second bit lines connected to a selected memory cell to be a first and second potentials to conduct a write operation, and after the write operation, transmits a control signal to the equalizer circuit between the first and second bit lines to activate the equalizer circuit to equalize potentials of the first bit line and the second bit line, thereby bringing into floating states.

9 Claims, 18 Drawing Sheets

LOGIC OF OPERATION OF EL SIGNAL

| WL | CL | EL | CELL STATE |
|---|---|---|---|
| NOT SELECTED | NOT SELECTED | SELECTED | NON-SELECTED STATE NO CURRENT FLOWS |
| NOT SELECTED | SELECTED | NOT SELECTED | BIT LINE SELECTED BUT WORD LINE NOT SELECTED NO CURRENT FLOWS |
| SELECTED | NOT SELECTED | SELECTED | WORD LINE SELECTED BUT EQUALIZER CIRCUIT OPERATES NO CURRENT FLOWS |
| SELECTED | SELECTED | NOT SELECTED | CELL SELECTED, EQUALIZER CIRCUIT TURNED OFF CELL CURRENT FLOWS |

FIG. 10

MAGNETIC MEMORY

CROSS REFERENCE TO RELATED APPLICATIONS

This application is based upon and claims the benefit of priority from the prior Japanese Patent Application No. 2013-63764, filed on Mar. 26, 2013, the entire contents of which are incorporated herein by reference.

FIELD

Embodiments described herein relate generally to magnetic memories.

BACKGROUND

Recently, the performance of processors included in mobile devices such as smartphones is rapidly improving. The high-performance processors for mobile applications have a significant problem in that the battery run time is short. Therefore, not only the performance of the processors but also the power consumption thereof is important. A study on the use of nonvolatile memories such as spin transfer torque magnetic random access memories (STT-MRAMs) as cache memories for the processors is recently attracting attention as a technique for reducing power consumption of the processors. Unlike volatile memories such as SRAMs, nonvolatile memories can hold data even if no power is supplied. Accordingly, nonvolatile memories are expected to reduce standby power.

However, nonvolatile memories generally have a problem in that power consumption during operation is great. For this reason, although various ideas for using nonvolatile memories as cache memories have been made public, no high-performance processor actually using nonvolatile memories as cache memories has been commercially available. Furthermore, no nonvolatile memory has been made available, which meets the operational speed and the operational power requirements of high-performance processors.

It is known that all bit lines in a memory are pre-charged or pre-discharged before a next cycle starts in order to avoid a half select state of memory cells connected to a word line. However, as will be described later, the power consumed for pre-charging or pre-discharging is not essentially required for memory operation, but needed only to avoid malfunctions. Furthermore, the power needed to charge or discharge bit line pairs is for pre-charging or pre-discharging all the bit line pairs after a read or write operation, and is superfluous.

BRIEF DESCRIPTION OF THE DRAWINGS

FIG. 10 is a diagram for explaining the logic of control signals for the equalizer circuit.

DETAILED DESCRIPTION

Figure 1:
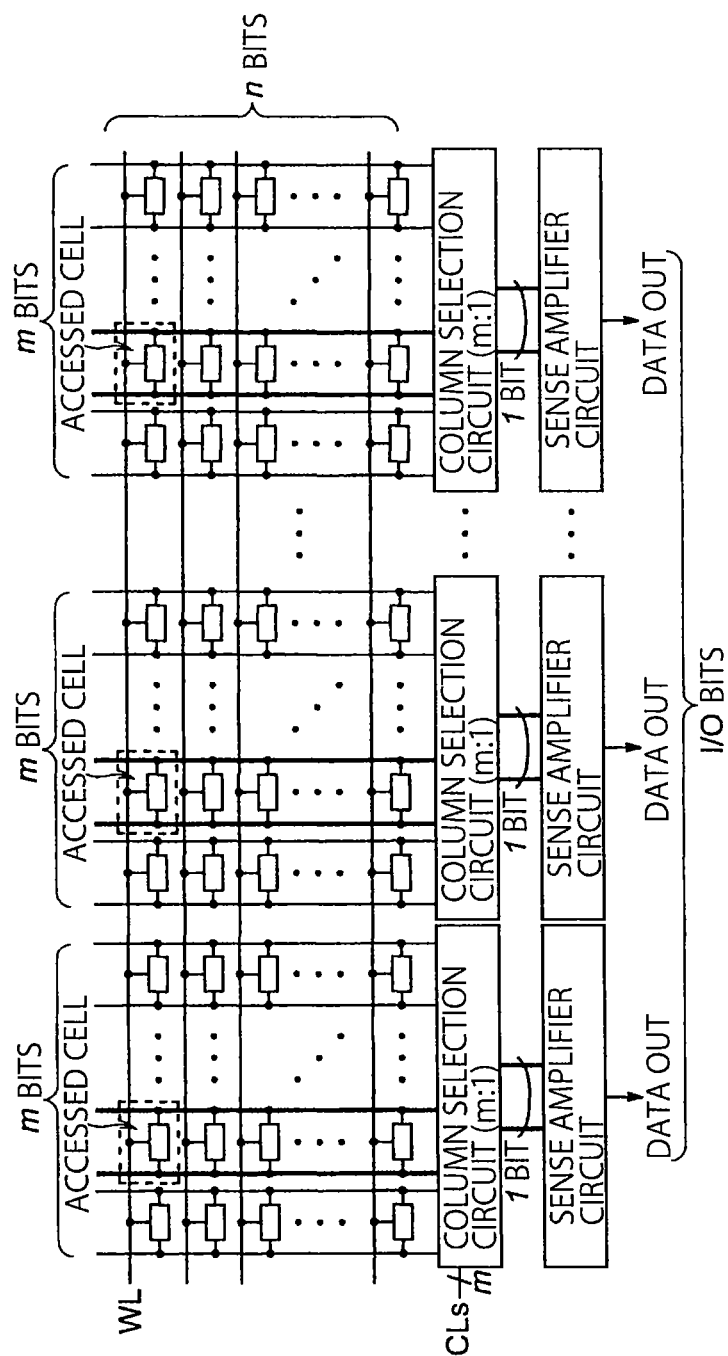
FIG. 1 is a schematic diagram of a memory array including a column selecting structure.

A magnetic memory according to an embodiment includes: a plurality of memory cells arranged in an array form, each memory cell including a first MTJ element having a first terminal and a second terminal, and a first selection unit including a third terminal, a fourth terminal, and a fifth terminal, the third terminal being connected to the first terminal of the first MTJ element, and selecting the first MTJ element based on a row selection signal; a pair of a first bit line and a second bit line provided to each column of the memory cells, the first bit line being connected to the second terminal of the first MTJ element of a memory cell in a corresponding column, and the second bit line being connected to the fourth terminal of the first selection unit of the memory cell of the corresponding column, the first bit line and the second bit line being selected by a column selection signal; a word line provided to each row of the memory cells, and connected to the fifth terminal of the first selection unit of each memory cell in the one of the rows to transmit the row selection signal to the first selection unit; an equalizer circuit provided to each column of the memory cells, and to connect between the first bit line and the second bit line; and a control circuit that sets the first bit line and the second bit line connected to a selected memory cell to be a first and second potentials to conduct a write operation to the selected memory cell, and after the write operation, transmits a control signal to the equalizer circuit between the first bit line and the second bit line connected to the selected memory cell to activate the equalizer circuit to equalize the first and second potentials of the first bit line and the second bit line, thereby bringing into floating states.

Before embodiments are described, how the inventors have reached the embodiment will be described.

A magnetic tunneling junction (MTJ) element, which is a variable-resistance nonvolatile element having two terminals, generally includes two magnetic layers and a nonmagnetic layer located between the magnetic layers. Depending on whether the directions of magnetization of the two magnetic layers are parallel or antiparallel to each other, the resistance value between the two magnetic layers becomes a low-resistance state (hereinafter also referred to as the "P" state) or high-resistance state (hereinafter also referred to as the "AP" state). The variable-resistance nonvolatile element can keep the above resistance states in a nonvolatile manner.

The resistance states AP and P can be arbitrarily switched by flowing a current with a switching current value $I_W$ or more to flow, the switching current value $I_W$ being determined for each MTJ element. Normally, a nonvolatile memory of this type has a 1T-1R configuration in which a selection transistor (in most cases an nMOS transistor) and a variable-resistance element constitute a memory cell of 1 bit.

In a memory including 1T-1R memory cells, when one of word lines WL is selected and the potential thereof becomes "H," selection transistors of the memory cells connected to the word line WL are turned "ON" to electrically connect each of corresponding variable-resistance elements to a pair of bit lines BL, /BL. After cells are selected in this manner, a current flows through a variable-resistance element depending on the potentials of the bit line BL and the bit line /BL to perform a read operation and a write operation. In a read operation, a resistance value is read by a sense amplifier based on the value of the current flowing. In a write operation, a current is caused to flow in a direction determined by a value to be written. In a 1T-1R memory configuration, a reference current $I_{Ref}$ should be caused to flow through the sense amplifier for comparison in a read operation. The reference current should be higher than a current $I_{AP}$ that flows in the high resistance state, and lower than a current $I_P$ that flows in the low resistance state ($I_{AP} < I_{Ref} < I_P$). Generally, the reference current is generated using a reference cell having a combined resistance $R_{Ref} = (R_{AP} + R_P)/2$ obtained from an element $R_{AP}$ in the high resistance state and an element $R_P$ in the low resistance state connected in parallel.

The value of the reference current $I_{Ref}$ is a mean value of the value of the current $I_{AP}$ in the high resistance state and the value of the current $I_P$ in the low resistance state ($I_{Ref} = (I_{AP} + I_P)/2$). Accordingly, the difference in current that should be amplified by the read circuit (sense amplifier) becomes less than half of the difference between the value of the current $I_{AP}$ and the value of the current $I_P$ obtained from a resistance change rate (MR ratio). Therefore, the sense amplifier is required to amplify a very slight current difference, about a few μA. This leads to a degradation of reading speed and an increase in sense amplifier circuit area.

In order to solve such a problem, a 2T-2R configuration using two variable-resistance elements is proposed. The two variable-resistance elements include an element in a high-resistance state "AP" and an element in a low-resistance state "P" in a complementary manner. Two reading bit lines BL, /BL compare read currents in a read operation. When a word line WL is selected and the potential thereof becomes "H," all the selection transistors (hereinafter also referred to as "access transistors") connected to the selected word line WL are turned "ON," by which each of the corresponding variable-resistance elements is electrically connected to the bit line pairs BL and SL, and /BL and /SL.

In a read operation of a 2T-2R memory, a sense amplifier amplifies the difference between cell currents flowing through the two resistance elements. Accordingly, no reference current is needed. The difference in current to be amplified is the difference between the current value $I_{AP}$ and the current value $I_P$, which is twice the difference in a 1T-1R cell using a reference current $I_{Ref}$ for the comparison. Accordingly, the read operation can be performed faster than the read operation in 1T-1R memories.

A memory array such as that of an SRAM typically reads and writes data by activating a cell selected from a column direction and a row direction. Improvement in integration of memory cells in a nonvolatile memory using variable-resistance elements is a matter of concern. As a result, 256 to 1024 memory cells are connected in a word line WL direction (column direction), and a bit line BL direction (row direction).

However, the number of data bits inputted or outputted at a time corresponds to the width of an input/output section (hereinafter also referred to as "I/O section"), and the number of sense amplifiers is also typically the same as the number of I/O sections. Therefore, when a word line WL is selected, cells corresponding to the width of the I/O section or the number of sense amplifiers perform a read or write operation, but the remaining cells are in an NOP state (in which the cells only hold data but do not perform read or write operation). This state, in which a word line WL is selected but no bit line pair is selected, is called a "half select" state.

Similarly, a state in which a bit line pair BL, /BL is selected but no word line WL is selected is also a half select state. Thus, the half select state means a state where a cell is selected only in a column direction or in a row direction.

FIG. 1 is a schematic diagram showing a memory array having a column selection structure. A column-selection circuit for selecting a bit line pair to be connected is connected to each sense amplifier. For example, a column-selection circuit (m:1) selects a column from m columns corresponding to m bit line pairs using m column-selection signals CLs generated by Y addresses (column addresses), and connects a bit line pair corresponding to the selected column to the sense amplifier circuit. The bit line pairs other than the selected bit line pair are not connected to the sense amplifier circuit.

There is a problem in that the data holding characteristics (static noise margin (SNM)) of a cell in the half select state become worse than those of non-selected cells since the potential of the word line WL or bit line pair BL, /BL connected thereto changes. If a half-select state occurs in a column direction, no current flows through the cells since no access transistor is selected. Therefore, basically the data holding characteristics are not changed. If a half select state occurs in a row direction, a current flows through the cells (variable-resistance elements) depending on the potentials of the bit line pairs since the selection transistors are selected. As a result, depending on the value of the current flowing, there is a possibility that the data held in the cells may be lost. Thus, if the value of the current flowing through the cells in the half select state is equal to or more than the write current value $I_W$, the resistance value of the variable-resistance elements is rewritten and the data held in the elements is corrupted.

A disturbance may possibly occur in a nonvolatile memory such as an MRAM, in which the resistance change rate of a variable-resistance element is low, if a current higher than a certain level ($>I_W$) flows through the variable-resistance element since data bits in the MRAM are easily switched by such a current. Therefore, the potential of bit line pairs should be maintained at the same level so that the data held by internal nodes are not corrupted. For this purpose, a method is known in which a discharge mechanism is introduced to discharge all the bit lines before any cycle starts. The discharge decreases the potential of the bit line pairs to "L," and therefore no cell current flows through cells in the half select state connected to the selected word line WL.

Similarly, a method is known in which bit lines are pre-charged to an "H" level. Such a pre-charge mechanism or pre-discharge mechanism can prevent a current from flowing through the cells in the half select state.

However, since all the bit lines should be charged or discharged to an "H" or "L" potential, the power consumption may be increased.

Figure 2:
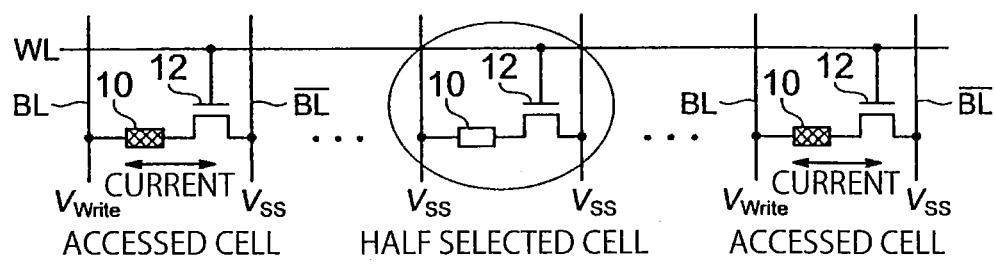
FIG. 2 is a diagram showing a memory array including half-selected cells and accessed cells.
Figure 3:
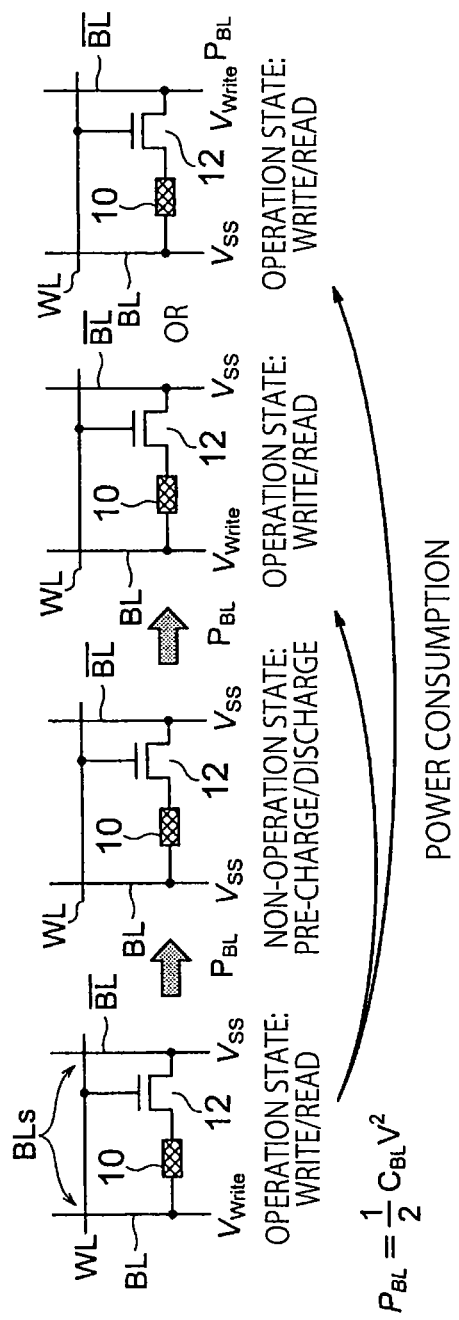
FIG. 3 is a diagram for explaining pre-charging and pre-discharging operations for preventing malfunctions.

It is assumed that a memory array includes cells in the half select state and cells to be accessed, as shown in FIG. 2. Each cell includes an MTJ element 10 and a selection transistor 12. A bit line pair of a cell in this memory cell array is pre-charged or pre-discharged every time the cell is accessed as shown in FIG. 3. For example, in a write operation, the potentials of the bit line pair (BL, /BL) are set at a high level and a low level (H, L). When the cell is brought into the non-access state, it is discharged so that the potentials of the bit line pair are set at (L, L), and then accessed again so that the potential are set at (H, L). The charging or discharging power of the bit line pair when the cell is accessed is as follows:

$$P_{BL} = \tfrac{1}{2} \cdot C_{BL} \cdot V_{DD}^2$$

where $C_{BL}$ is the capacity of the bit line. The energy $P_{BL}$ is consumed again when the cell is brought into the non-access state and discharged so that the potentials of the bit line pair become (L, L). The energy $P_{BL}$ is further consumed when the cells is accessed again. Since a leakage current flows through non-accessed cells, the potentials of the non-accessed bit line pair are charged or discharged due to the leakage current. Every time the bit lines are pre-charged or pre-discharged, charging or discharging to the "H" potential or "L" potential is performed, which consumes power unnecessarily. Power consumption by non-accessed cells leads to a critical problem of an increase in power in highly integrated memories including large-capacity memory cells.

The current consumed by the pre-charge or pre-discharge performed to avoid the half select state in the word line WL is not essential to the memory operation, but is simply for preventing malfunctions. The bit line pairs shown in FIG. 3 consume unnecessary power since all the bit line pairs are pre-charged or pre-discharged after every read or write operation.

Under such circumstances, the inventors of the present invention believed that a reduction in power consumption of non-selected cells would lead to a considerable reduction in power consumption of the entire magnetic memory.

Principle of Embodiment

Next, the principle of the embodiment will be described. As described above, in a variable-resistance nonvolatile memory (1T-1R, 2T-2R, or nT-nR type) using two variable-resistance elements, a higher current than a current in a read operation is caused to flow through the resistance elements in a write operation. In this manner, a stable write operation and a read operation with a satisfactorily low current that does not cause an erroneous writing are achieved. The potential difference between bit lines in a bit line pair differs between a read operation and a write operation. For example, the potentials of a bit line pair (BL, /BL) is set at a read potential $V_{Read}$ and a reference potential $V_{SS}$ in a read operation, and a write potential $V_{Write}$ and the reference potential $V_{SS}$ in a write operation. The write potential $V_{Write}$ is often twice higher than the read potential $V_{Read}$.

If the bit line pair BL, /BL keeps the potential difference $V_{write}-V_{SS}$ after the write operation, an erroneous writing may be caused due to the half select state. Therefore, the potential difference should be cancelled before the next cycle. Conventionally, the bit line pair BL, /BL is pre-charged or pre-discharged before a read operation. A memory with a pre-charging mechanism discharges one of the bit lines BL and /BL having been charged to be at the write potential $V_{Write}$ to the read potential $V_{Read}$ and charges the other having been discharged to be at the reference potential $V_{SS}$ to the read potential $V_{Read}$ after a write operation. A memory with a pre-discharge mechanism discharges the bit line having been charged to the write potential $V_{Write}$, for example the bit line BL, to the reference potential $V_{SS}$, and maintains the potential of the bit line having been discharged to the reference potential $V_{SS}$, for example the bit line /BL, after the write operation. In both the cases, the energy of $P_{BL\_Write} = \tfrac{1}{2} \cdot C_{BL} \cdot V_{Write}^2$ is consumed after the write operation.

The embodiment described below has a mechanism in which the potential of the bit line having been charged to the write potential $V_{Write}$ is moved to the other bit line having been discharged to the reference potential $V_{SS}$ (hereinafter referred to as "charge sharing"), so that the potential of the bit lines in the bit line pair is set to be at a floating potential instead of the read potential $V_{Read}$ or reference potential $V_{SS}$. The charge sharing further reduces power consumption after the write operation, and also avoids the half select state.

First Embodiment

Figure 4:
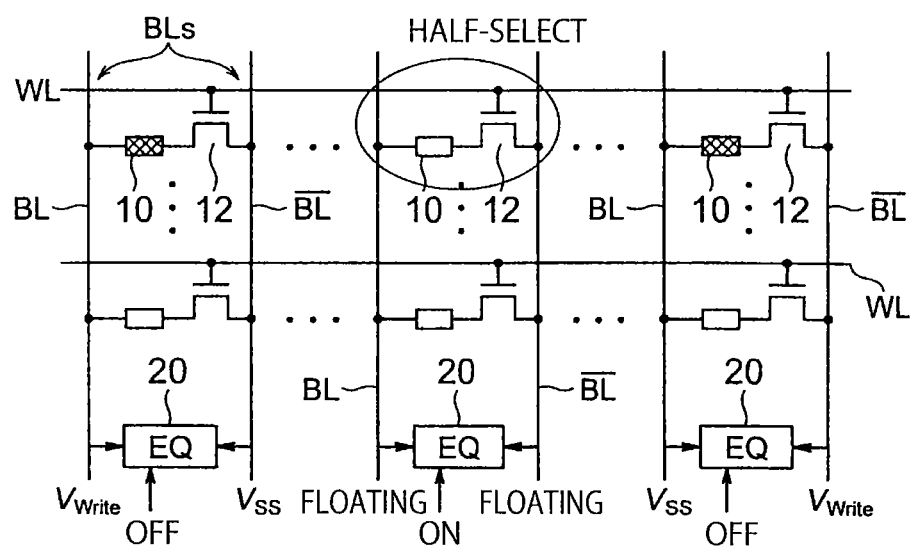
FIG. 4 is a circuit diagram showing a magnetic memory of the first embodiment.

FIG. 4 shows a magnetic memory according to the first embodiment. The magnetic memory according to the first embodiment includes memory cells arranged in an array. Each memory cell includes an MTJ element 10 and a selection transistor 12. Memory cells in a common column share a bit line pair BL, /BL, and memory cells in a common row share a word line WL. One end of the MTJ element 10 of each memory cell is connected to one bit line BL of the bit line pair and the other is connected to one of a source and a drain of the selection transistor 12. The other of the source and the drain of the selection transistor 12 of each memory cell is connected to the other bit line /BL of the bit line pair, and a gate is connected to a corresponding word line WL.

An equalizer circuit 20 is provided between the bit line pair BL, /BL in the first embodiment. The equalizer circuit 20 operates to eliminate the potential difference between the bit line pair BL, /BL, so that no current flows through the MTJ element. As a result, no current flows through the cells in the half select state, thereby avoiding data corruption caused by the half select state. The equalizer circuit 20 may be formed of, for example, an MOS transistor as will be described later. If the potential difference is eliminated between the source and the drain of the MOS transistor, the current immediately stop flowing through the equalizer circuit 20. Thus, the equalizer circuit 20 does not always consume power.

Figure 5:
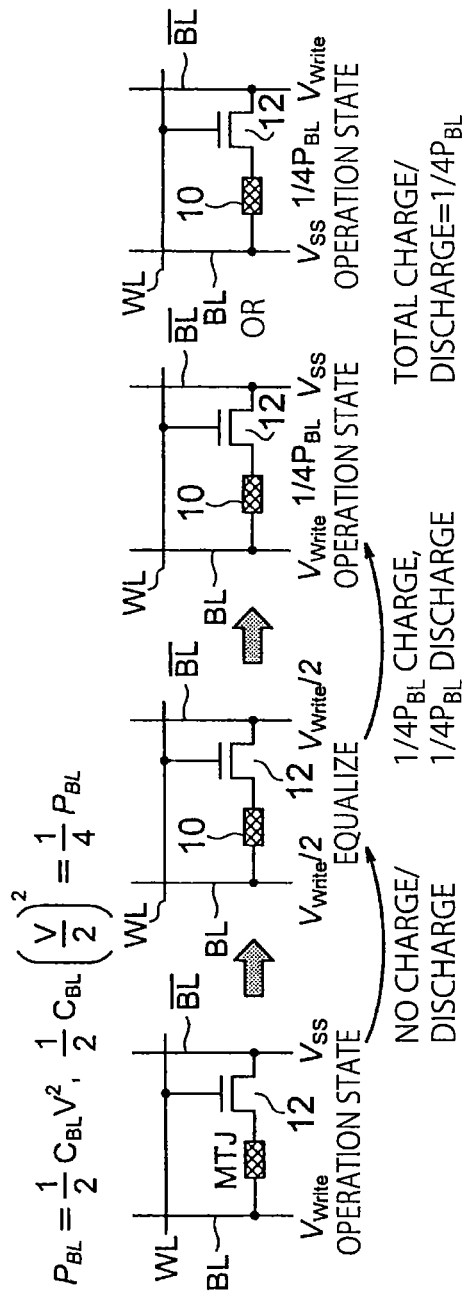
FIG. 5 is a diagram for explaining a mechanism of reducing power consumption in the first embodiment.

Next, the mechanism of reducing power consumption in the first embodiment will be described with reference to FIG. 5. A large-capacity memory array inevitably includes half-selected cells. The energy consumed after a write operation is to be calculated. In a write operation, the bit line pair BL, /BL is set at the write potential $V_{Write}$ and the reference potential $V_{SS}$. After the write operation, charge sharing is performed between the bit line pair BL, /BL by means of the equalizer circuit 20 shown in FIG. 4. As a result, the write potential $V_{Write}$ and the reference potential $V_{SS}$ both becomes $V_{Write}/2$. Although the equalizer circuit 20 itself consumes slight amount of power, the period in which a current flows through the equalizer circuit 20 is in the order of a few hundreds ps. Thus, the loss of charge is negligible. Therefore, no power is consumed by the charge sharing. As a result, the energy $P_{BL\_Write} = \tfrac{1}{2} \cdot C_{BL} \cdot V_{Write}^2$ that was consumed during the pre-charging and the pre-discharging in conventional devices can be saved.

In a spin transfer torque magnetic random access memory (STT-MRAM), the write potential $V_{Write}$ is almost twice the read potential $V_{Read}$. Accordingly, the charge sharing substantially sets the potential of the bit line pair at the read potential $V_{Read}$. This is advantageous in that in a next read operation, the energy for charging the bit line to the read potential $V_{Read}$ is substantially not needed.

Both the devices that perform pre-charging and the devices that perform pre-discharging consume the energy of $\frac{1}{2} \cdot C_{BL} \cdot V_{Write}^2$, unlike the first embodiment.

Even if the operation next to the equalizing is a write operation, the potentials of the bit lines are set from $V_{Write}/2$ to the write potential $V_{Write}$ and the reference potential $V_{SS}$. Therefore, the first embodiment consumes the energy of $\frac{1}{2} \cdot C_{BL} \cdot (\frac{1}{2} \cdot V_{Write})^2 \cdot 2 = \frac{1}{4} \cdot C_{BL} \cdot V_{Write}^2$. Thus, the energy required for setting the voltages in a write operation can be reduced to half as compared to the energy consumed in the pre-charging or pre-discharging.

The write energy of a nonvolatile variable-resistance element is determined by an integral value of a write pulse. Accordingly, the energy of current pulse flowing through the variable-resistance element is needed in addition to the initially set energy. However, as the variable-resistance elements are scaled down in size, the time width and the current value are also decreased. Therefore, the technique of the first embodiment capable of reducing the energy consumed for setting voltages to half helps to greatly reduce power consumption.

Furthermore, in the first embodiment, the bit line pair is not actively controlled by pre-charging or pre-discharging, but is brought into a floating state by the charge sharing. Therefore, a bit line pair that is not accessed for a long time would autonomously stabilize at a stable potential due to leakage current. Therefore, the leakage current in the stable state after a sufficient time has passed from the last access can be reduced as compared to the case where a non-autonomous circuit for intentionally setting a voltage value is provided. Furthermore, the power consumed in a standby state can be efficiently reduced by having a floating state.

This embodiment can also be applied to cache memories. A cache memory of a processor becomes to be in a standby state when it is not accessed for a few cycles. However, in a volatile memory such as an SRAM, a voltage of a certain level or more should continuously be supplied to memory cells in order to hold data. Furthermore, a nonvolatile memory including a pre-charging or pre-discharging mechanism constantly consumes power to pre-charge or pre-discharge the bit lines.

However, since the first embodiment includes an equalizer circuit for performing charge sharing between a bit line pair, no power is necessarily consumed to hold data. In addition, the bit line pair can be completely brought into a floating state, thereby reducing the power consumption of the memory cell array portion to be "substantially zero." If the bit line pair is simply brought into a floating state completely, however, the potential of the word line WL relatively increases, and when the selection transistor is turned on, a current may flow through the cell depending on the potential difference between the bit line pair BL, /BL.

Even in such a case, no current flows through the variable-resistance element (MTJ element) of the first embodiment since there is no potential difference between the bit line pair. This can prevent erroneous writing. This is effective to perform power gating at a high speed.

As described above, according to the first embodiment, in which charging or discharging is not unnecessarily performed, it is possible to accelerate the reduction in power consumption.

Each memory cell of the magnetic memory according to the first embodiment shown in FIG. 4 includes the MTJ element 10 that is the variable-resistance element, and the selection transistor 12. Alternatively, each memory cell may have the configurations shown in FIGS. 6(a) to 6(f). For example, the memory cell shown in FIG. 6(a) includes a variable-resistance element 10 and a selection transistor 12, one end of the variable-resistance element 10 being connected to a bit line BL and the other being connected to one of a source and a drain of the selection transistor 12. The other end of the source or drain of the selection transistor 12 is connected to a bit line /BL and a gate thereof is connected to a word line WL.

Figure 6:
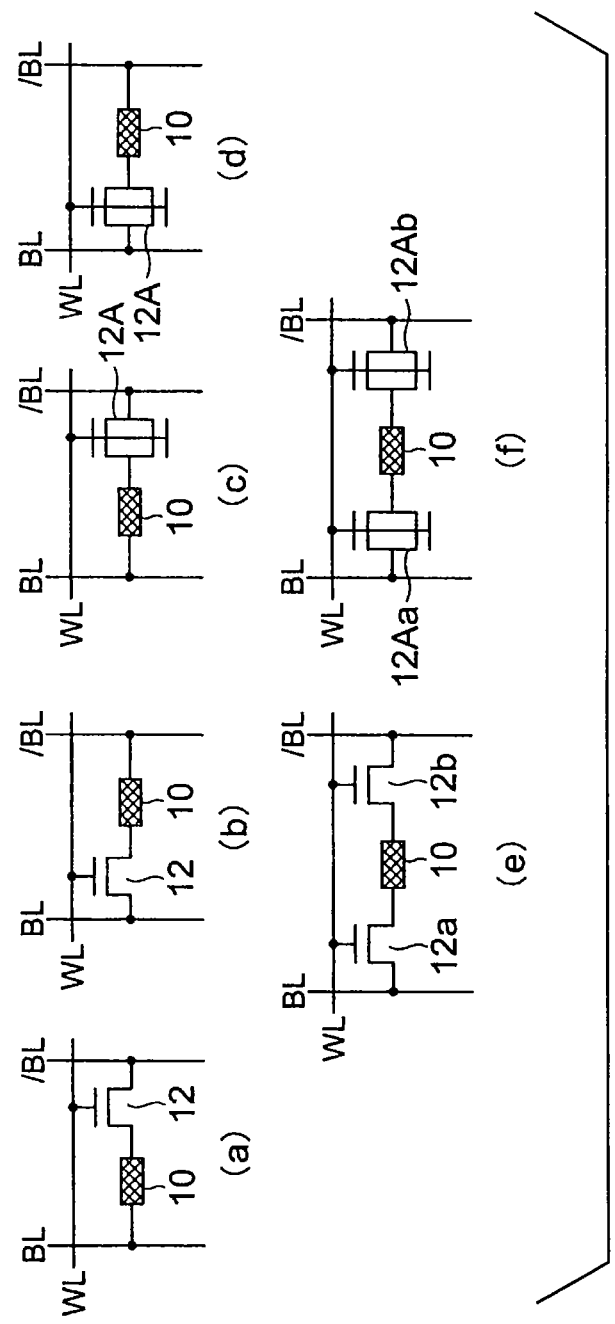
FIGS. 6(a) to 6(f) are diagrams showing examples of 1R-type memory cells.

The memory cell shown in FIG. 6(b) is obtained by connecting the one end of the variable-resistance element 10 to the bit line /BL and connecting the other end of the source and the drain of the selection transistor 12 the bit line BL in the memory cell shown in FIG. 6(a).

The memory cell shown in FIG. 6(c) is obtained by replacing the selection transistor 12 with a transfer gate 12A including an nMOS transistor and a pMOS transistor in the memory cell shown in FIG. 6(a). The gate of the transfer gate 12A is connected to the word line WL. The memory cell shown in FIG. 6(d) is obtained by replacing the selection transistor 12 with the transfer gate 12A in the memory cell shown in FIG. 6(b).

The memory cell shown in FIG. 6(e) includes a variable-resistance element 10 and two selection transistors 12a, 12b, one end of the variable-resistance element 10 being connected to one of a source and a drain of the selection transistor 12a, and the other end being connected to one of a source and a drain of the selection transistor 12b. The other of the source and the drain of the selection transistor 12a is connected to a bit line BL, and the other of the source and the drain of the selection transistor 12b is connected to a bit line /BL. Gates of the selection transistors 12a, 12b are connected to a word line WL.

The memory cell shown in FIG. 6(f) is obtained by replacing the selection transistors 12a, 12b with transfer gates 12Aa, 12Ab in the memory cell shown in FIG. 6(e).

A memory cell including two cells to hold 1-bit data as shown in each of FIGS. 7(a) to 7(f) can also be employed. In such a memory cell, differential data reading is performed. The memory cell shown in FIG. 7(a) includes a first cell having a variable-resistance element 10a and a selection transistor 12a, and a second cell having a variable-resistance element 10b and a selection transistor 12b. In the first cell, one end of the variable-resistance element 10a is connected to a bit line BL and the other is connected to one of a source and a drain of the selection transistor 12a. The other of the source and the drain of the selection transistor 12a is connected to a read line SL, and a gate thereof is connected to a word line WL. In the second cell, one end of the variable-resistance element 10b is connected to a bit line /BL, and the other is connected to one of a source and a drain of the selection transistor 12b. The other of the source and the drain of the selection transistor 12b is connected to a read line /SL, and a gate thereof is connected to the word line WL. It may be said that the bit line BL and the read line SL constitute a bit line pair, and the read line /SL and the bit line /BL constitute a bit line pair. This also applies to the memory cells shown in FIGS. 7(b) to 7(f).

Figure 7:
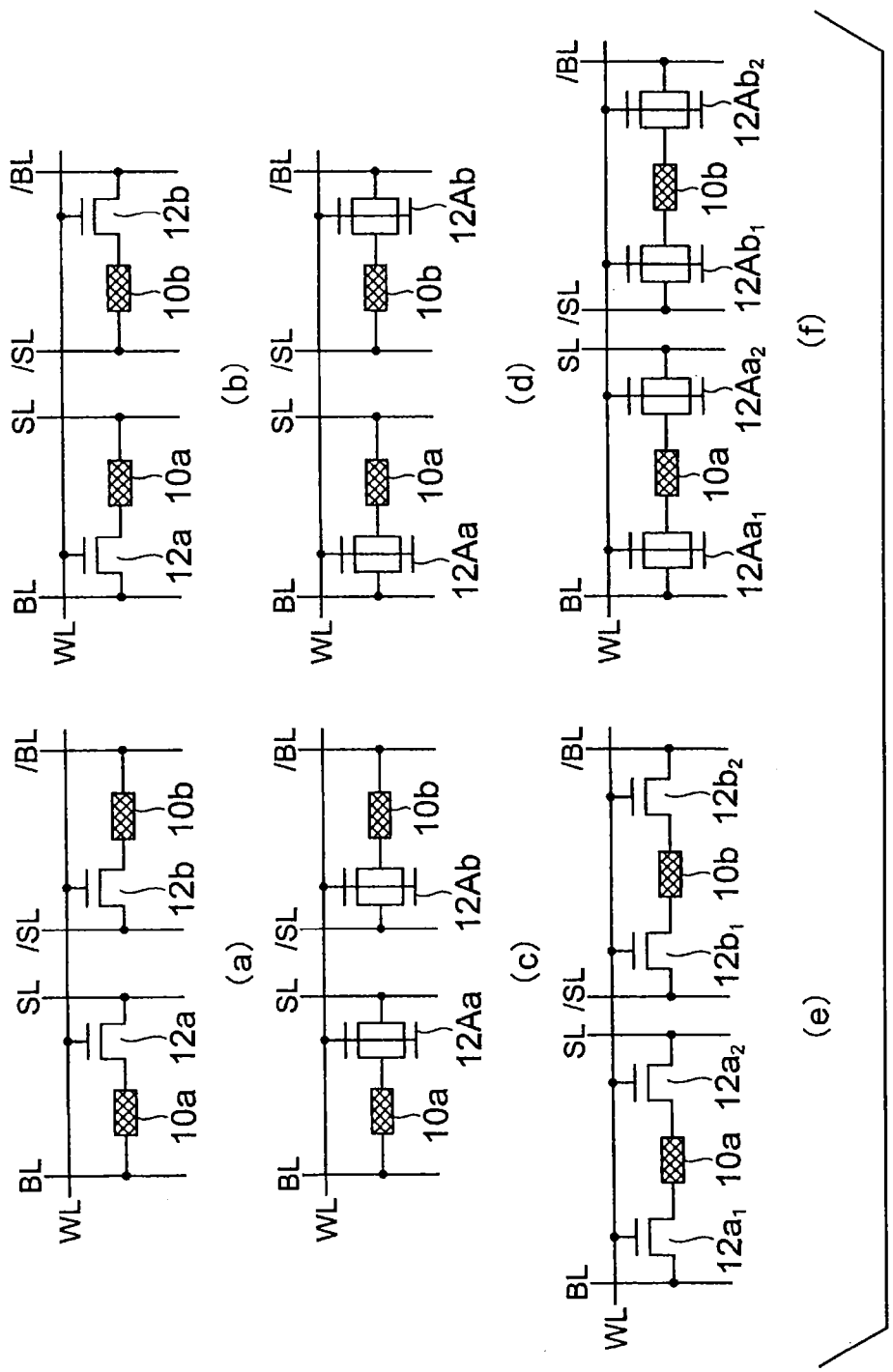
FIGS. 7(a) to 7(f) are diagrams showing examples of 2R-type memory cells.
Figure 8:
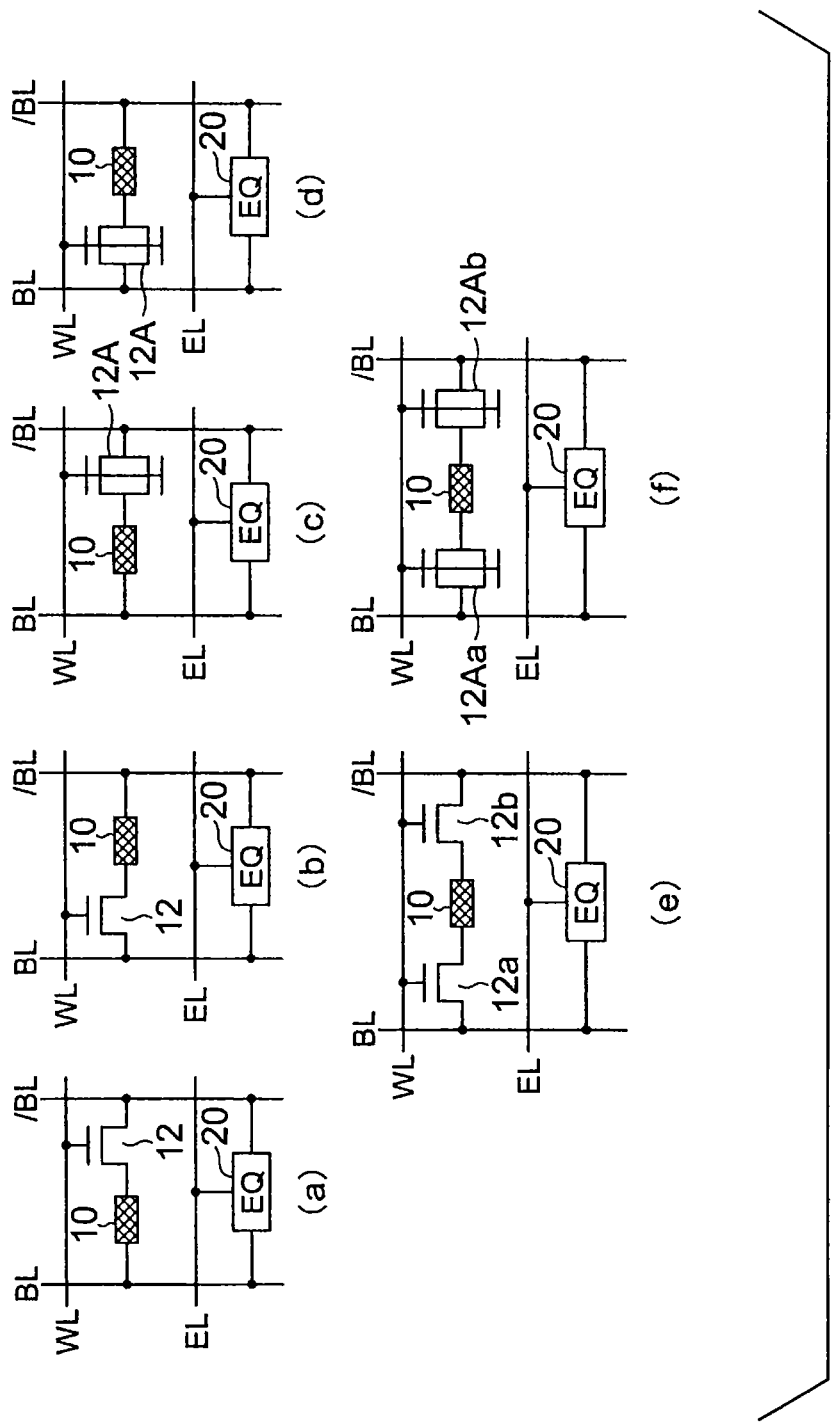
FIGS. 8(a) to 8(f) are diagrams showing examples in each of which an equalizer circuit is provided to a 1R-type memory cell.
Figure 9:
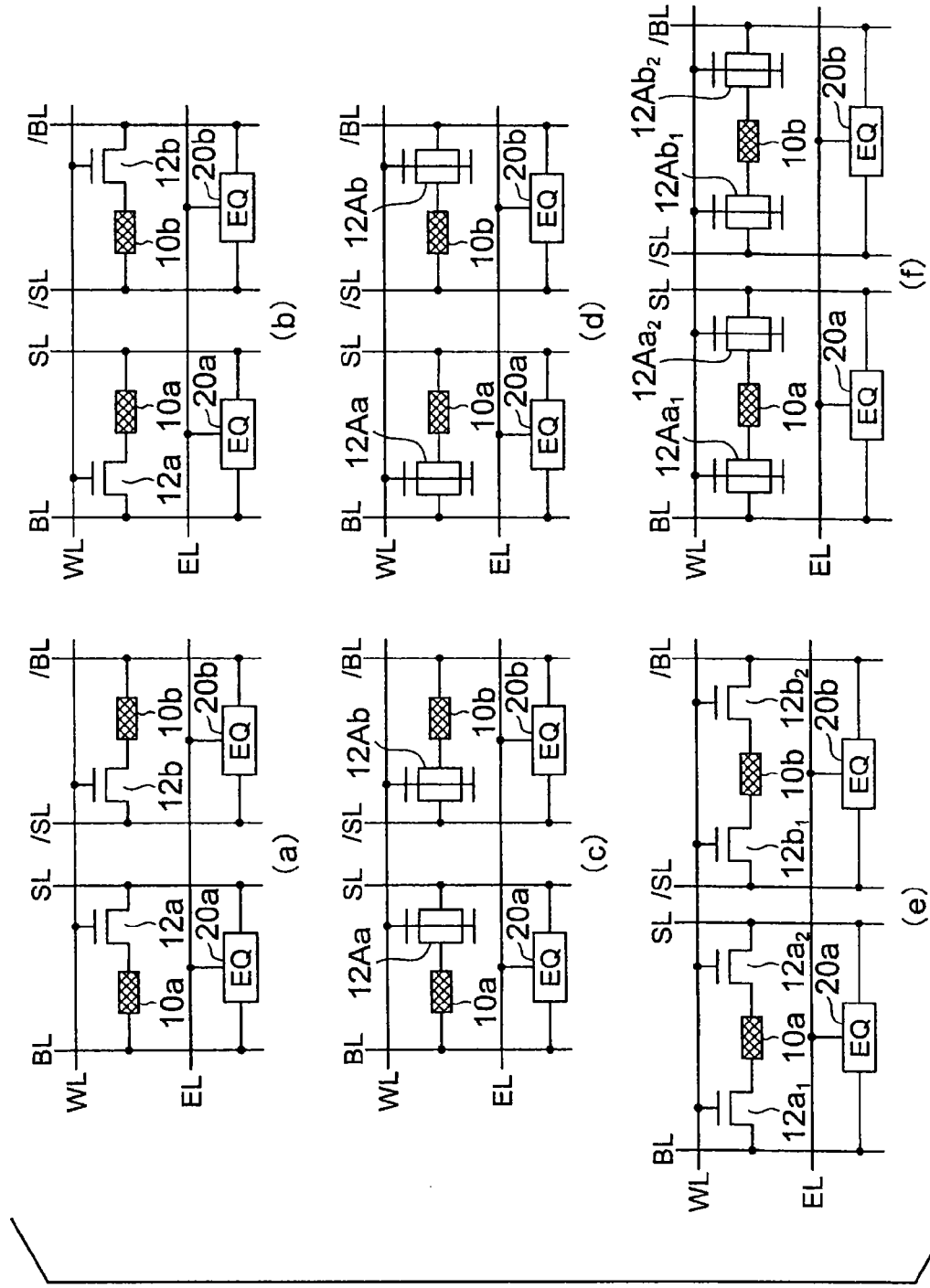
FIGS. 9(a) to 9(f) are diagrams showing examples in each of which an equalizer circuit is provided to a 2R-type memory cell.

The memory cell shown in FIG. 7(b) includes a first cell having a variable-resistance element 10a and a selection transistor 12a, and a second cell having a variable-resistance element 10b and a selection transistor 12b. One end of the variable-resistance element 10a in the first cell is connected to a read line SL, and the other is connected one of a source and a drain of the selection transistor 12a. The other of the source and the drain of the selection transistor 12a is connected to a bit line BL, and a gate thereof is connected to a word line WL. One end of the variable-resistance element 10b in the second cell is connected to a read line /SL, and the other is connected to one of a source and a drain of the selection transistor 12b. The other of the source and the drain of the selection transistor 12b is connected to a bit line /BL, and a gate thereof is connected to the word line WL.

The memory cell shown in FIG. 7(c) is obtained by replacing the selection transistors 12a, 12b in the first cell and the second cell of the memory cell shown in FIG. 7(a) with transfer gates 12Aa, 12Ab.

The memory cell shown in FIG. 7(d) is obtained by replacing the selection transistors 12a, 12b in the first cell and the second cell of the memory cell show in FIG. 7(b) with transfer gates 12Aa, 12Ab.

The memory cell shown in FIG. 7(e) includes a first cell having a variable-resistance element 10a and selection transistors $12a_1$, $12a_2$, and a second cell having a variable-resistance element 10b and selection transistor $12b_1$, $12b_2$. One end of the variable-resistance element 10a in the first cell is connected to one of a source and a drain of the selection transistor $12a_1$ and the other end is connected to one of a source and a drain of the selection transistor $12a_2$. The other of the source and the drain of the selection transistor $12a_1$ is connected to a bit line BL, and the other of the source and the drain of the selection transistor $12a_2$ is connected to a read line SL. Gates of the selection transistors $12a_1$, $12a_2$ are connected to a word line WL. One end of the variable-resistance element 10b in the second cell is connected to one of a source and a drain of the selection transistor $12b_1$, and the other is connected to one of a source and a drain of the selection transistor $12b_2$. The other of the source and the drain of the selection transistor $12b_1$ is connected to a read line /SL, and the other of the source and the drain of the selection transistor $12b_2$ is connected to a bit line /BL. Gates of the selection transistors $12b_1$, $12b_2$ are connected to the word line WL.

The memory cell shown in FIG. 7(f) is obtained by replacing the selection transistors $12a_1$, $12a_2$ in the first cell of the memory cell shown in FIG. 7(e) with transfer gates $12Aa_1$, $12Aa_2$, and the selection transistors $12b_1$, $12b_2$ in the second cell with transfer gates $12Ab_1$, $12Ab_2$.

Although the selection transistors in FIGS. 6(a), 6(b), 6(e), 7(a), 7(b), and 7(e) are nMOS transistors, pMOS transistors may also be used.

The first embodiment can be applied to a cell structure in which a plurality of transistors is arranged in parallel in order to secure a current value in a certain level or more.

Next, FIGS. 8(a) to 8(f) show cases where an equalizer circuit 20 is connected between the bit line pair BL, /BL to which the memory cell is connected in each of the memory cells shown in FIGS. 6(a) to 6(f).

Furthermore, FIGS. 9(a) to 9(f) show cases where equalizer circuits 20a, 20b are connected between the bit line BL and the read line SL, and between the bit line /BL and the read line /SL, to which the cells are connected in each of the memory cells shown in FIGS. 7(a) to 7(f).

In a memory cell structure including one variable-resistance element (1R type) as shown in FIGS. 6(a) to 6(f), the equalizer circuit 20 is connected between the bit line pair BL, /BL. A control signal EL controls the equalizer circuit 20 exclusively in the relationship with a column section signal (CL). Specifically, when the column section signal CL is selected, the control signal EL is not selected, and when the column section signal CL is not selected, the control signal EL is selected. As a result, only the equalizer circuit 20 of the cell that is accessed is turned OFF, and the equalizer circuits 20 of the cells, the columns of which are not selected, i.e., the non-selected cells and half select cells, are turned ON.

The control signal EL for controlling the equalizer circuit 20 operates in accordance with the logical inversion of the column section signal CL as shown in FIG. 10. Thus, when a column is selected, the corresponding equalizer circuits are turned OFF, and when the column is not selected, the equalizer circuits keep operating. In this manner, the potential difference between the bit line pair can be eliminated, and therefore data is not corrupted by the half select state. Since the potential difference between the bit line pair BL, /BL after a write operation is eliminated by charge sharing, no energy is lost, and the charge can be maintained in the bit line pair BL, /BL. This improves the reusability of the charge in the bit line pair BL, /BL, and enables the reduction in power for charging or discharging the bit lines.

Figure 11:
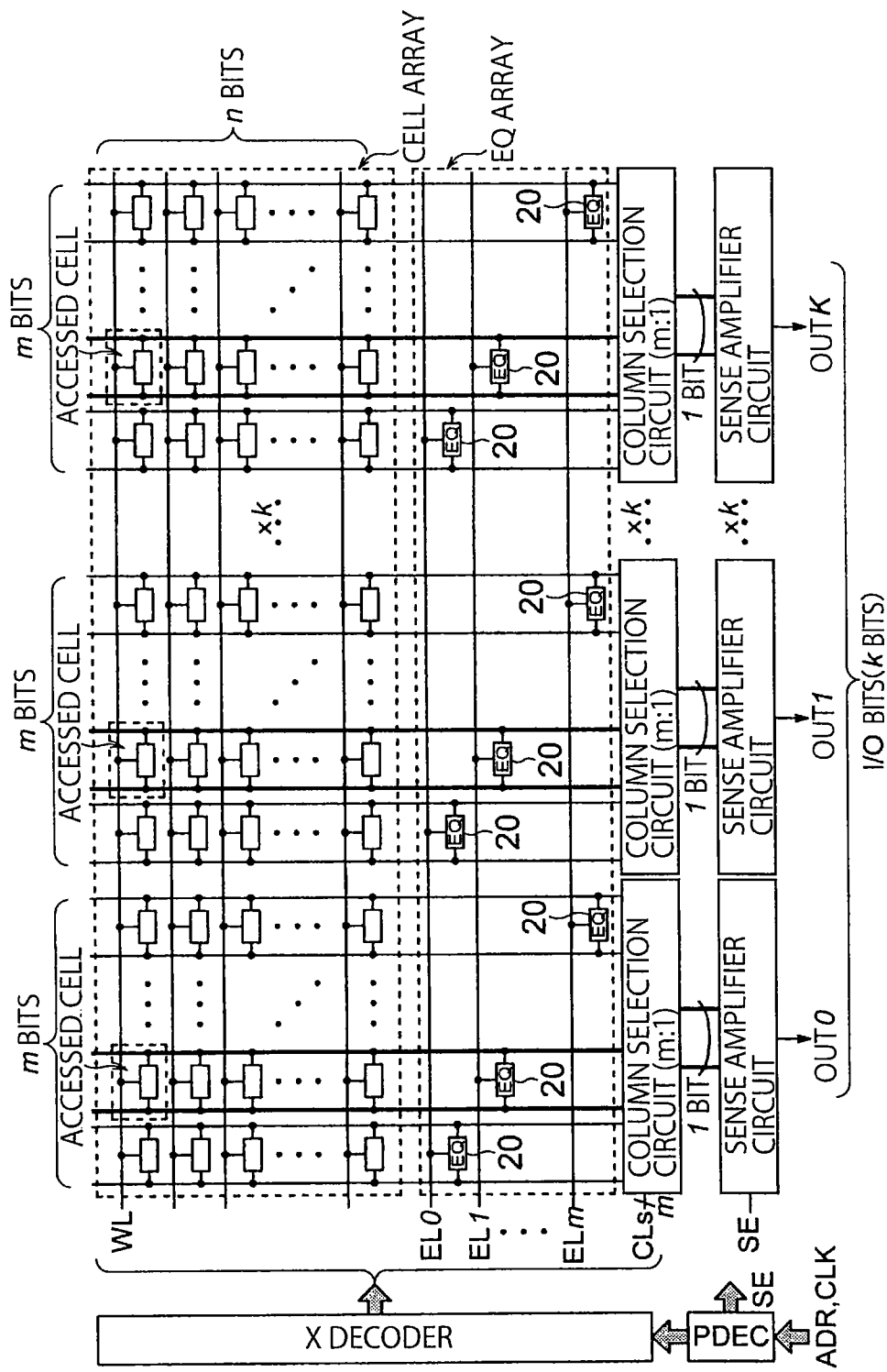
FIG. 11 shows a connection relationship among equalizer circuits, lines for control signals for controlling the equalizer circuits, and lines for column section signals.

FIG. 11 shows a connection relationship among the equalizer circuits, lines for the control signal EL for controlling the equalizer circuits, and lines for the column section signal CL. Although FIG. 11 is a block diagram showing 1R-type cells, the connection relationship shown in FIG. 11 substantially applies to 2R-type cells each including two variable-resistance elements as show in FIGS. 7(a) to 7(f). As the number of bit line pairs increases, the number of equalizer circuits increases, like the relationship between FIGS. 8(a) to 8(f) and FIGS. 9(a) to 9(f).

For simplification, the memory cells are represented by squares in FIG. 11. The lines for column section signal CL, the number of which is the same as that of the columns selectable by one sense amplifier circuit (m in FIG. 11), are arranged in the same direction as the word line WL, and connected to all the column selection circuit. The same number (m in FIG. 11) of the lines for control signal EL for controlling the equalizer circuits are arranged in the same direction as the word line WL, and control the ON/OFF states of the equalizer circuits 20. The number of equalizer circuits 20 connected to each line for control signal EL is the same as the number of bits simultaneously accessed (in FIG. 11, k, which is the number of sense amplifiers, i.e., the number of I/O bits). The number of word lines WL is the same as the number of bits connected to each bit line (n in FIG. 11).

A cell current flows through only an accessed cell, for which both the word line WL and the line for column section signal CL are selected, by arranging an equalizer circuit 20 for each column, and controlling it based on a logic that is inverse of the logic for controlling the column section signal CL, as shown in FIG. 11. In the first embodiment, no pre-charge circuit or pre-discharge circuit should be prepared as in conventional devices, and thus the current consumed for operating the pre-charge circuit or pre-discharge circuit can be saved. The signal for selecting word line WL, the control signal EL for controlling the equalizer circuit 20, and the column section signal CL are generated by an X decoder circuit at the timing determined by CLK signals based on a result of pre-decoding an address signal at a pre-decoding circuit (PDEC).

The circuit diagram shown in FIG. 11 shows the case where a timing generator circuit (TG circuit) is included in the PDEC circuit. Timing signals SE for operating the sense amplifier is outputted from the PDEC circuit.

Figure 12:
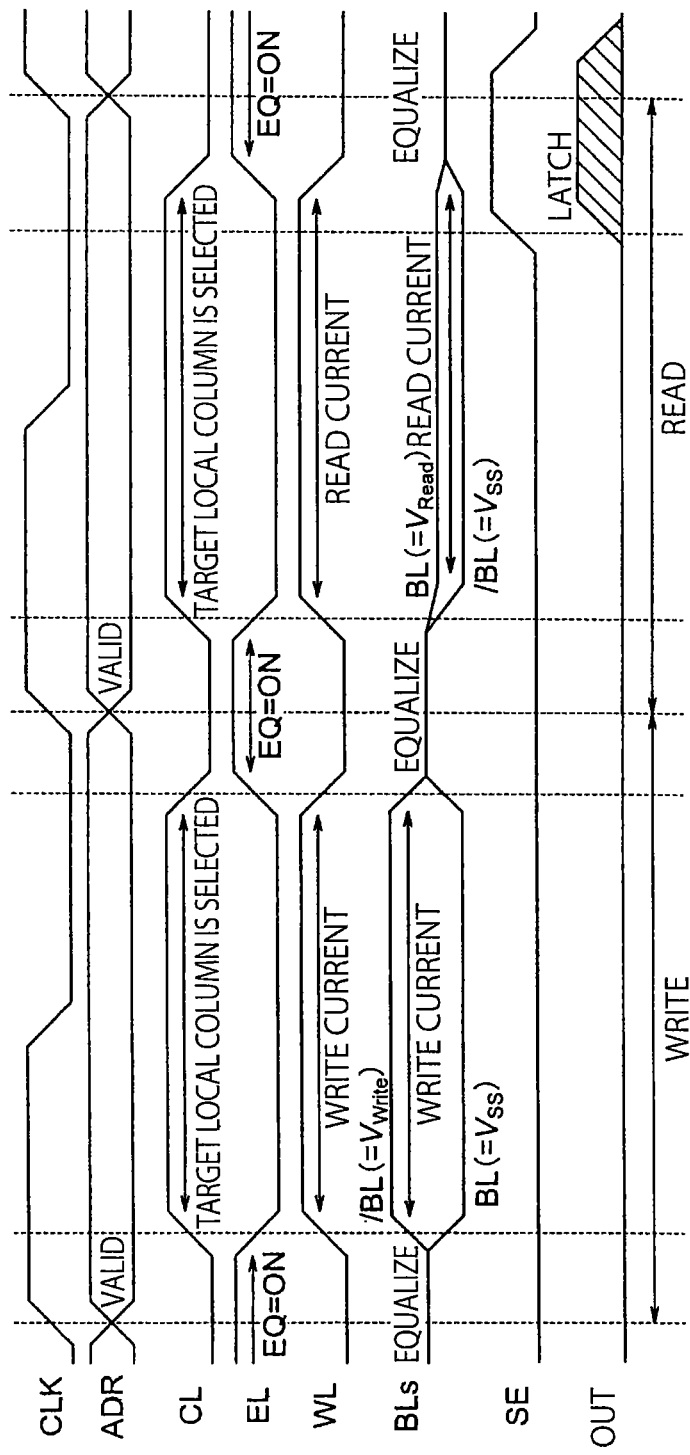
FIG. 12 is a diagram showing an example of operation waveforms of the circuit shown in FIG. 11.
Figure 13:
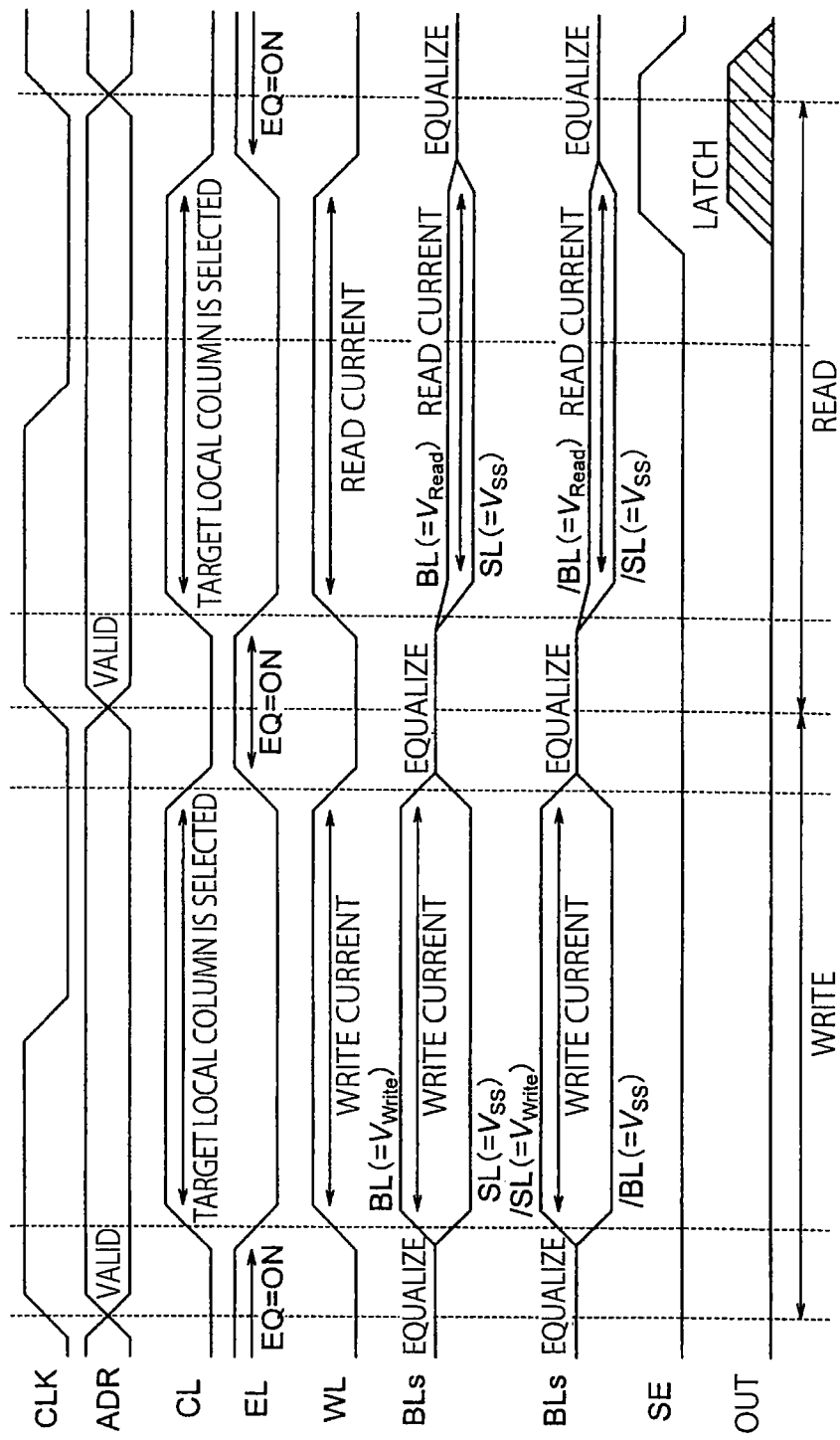
FIG. 13 is a diagram showing an example of operation waveforms of a circuit including 2R-type memory cells.

FIG. 12 shows an example of operation waveforms of the circuit shown in FIG. 11. FIG. 13 shows an example of operation waveforms of a circuit including 2R-type memory cells. In each case, operations can be performed smoothly without any delay since the potential difference between the bit line pair is eliminated by the equalizer circuit 20. Such a reduction in delay time can also be achieved by providing the equalizer circuits 20. Specifically, the first embodiment includes a control circuit (not shown) for transmitting a control signal to the equalizer circuit 20 connected between a pair of first bit line and second bit line connected to the selected memory cell after a write operation to the selected memory cell is finished in order to activate the equalizer circuit 20, thereby equalizing the potentials of the first bit line and the second bit line. As a result, after the write operation, the first bit line and the second bit line is brought into a floating state.

Figure 14:
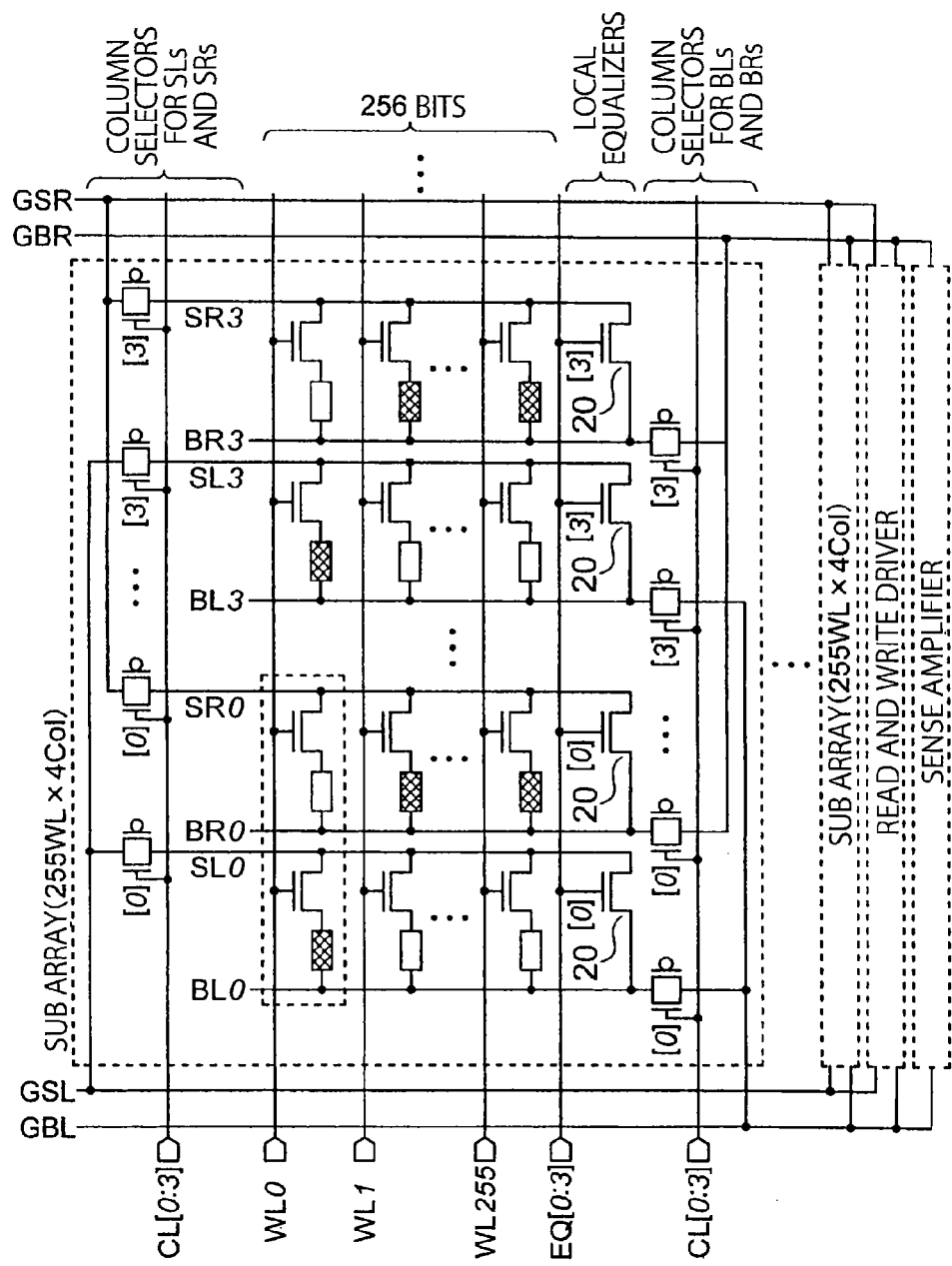
FIG. 14 is a diagram showing an example of equalizer circuit.

There are various configurations of the equalizer circuit 20. FIG. 14 shows a typical circuit configuration. In FIG. 14, an equalizer circuit 20 including an nMOS transistor is connected to each local bit line. In the example shown in FIG. 14, the configuration of a memory cell for holding data is similar to that of an equalizer circuit 20 except for whether there is a variable-resistance element or not. Accordingly, an equalizer circuit 20 can be added below a memory cell array without changing the regular layout of the memory cell array.

Figure 15:
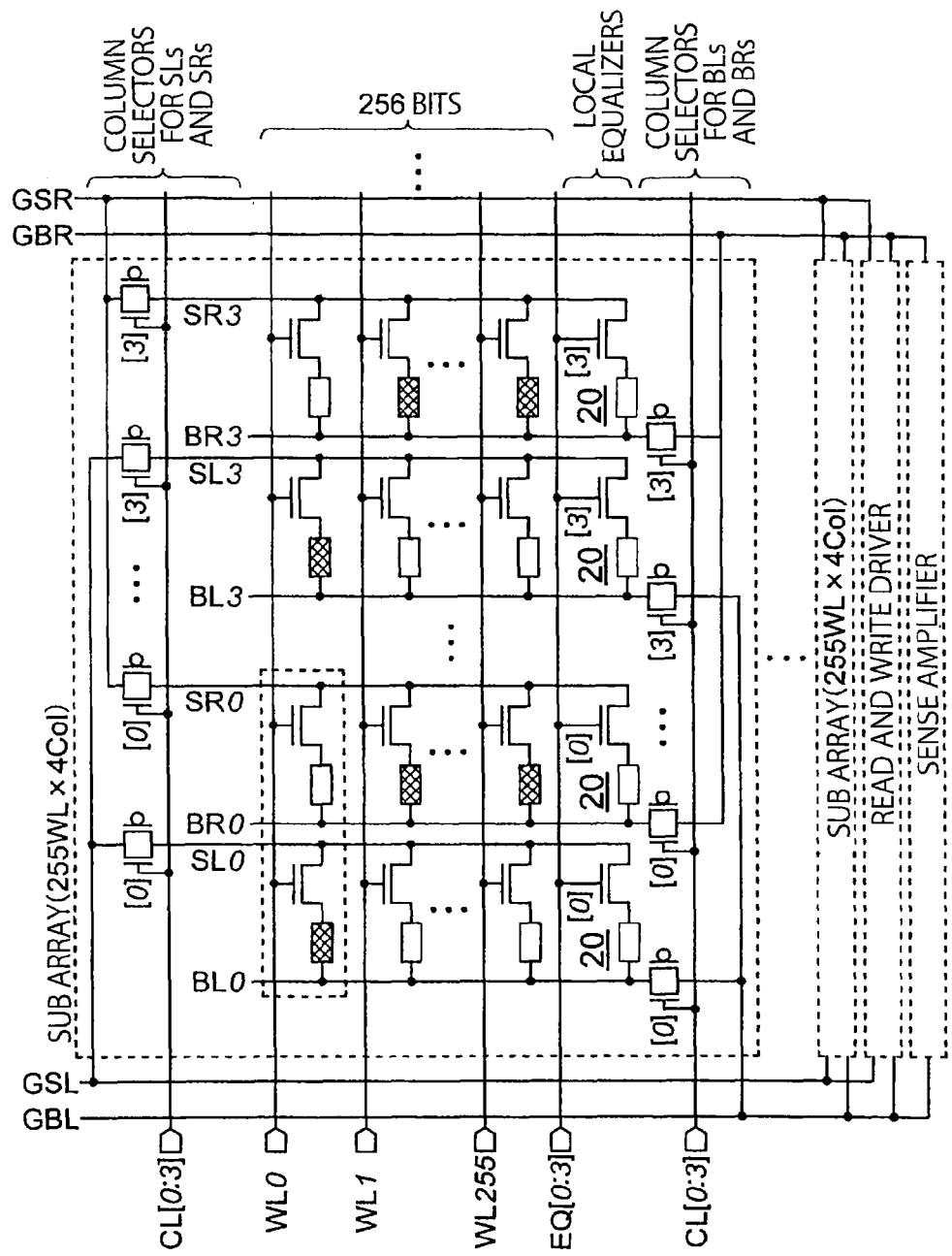
FIG. 15 is a diagram showing another example of equalizer circuit.

An equalizing operation can be performed even if there is a variable-resistance element in the equalizer circuit 20. Accordingly, dummy memory cells provided around the memory cell array for improving the yield can be used as the equalizer circuits 20 as shown in FIG. 15. This is a characteristic of memory cell arrays including 1T-1R memory cells.

The equalizer circuit 20 may include a pMOS circuit, or a transfer gate including a combination of an nMOS and a pMOS.

Figure 16:
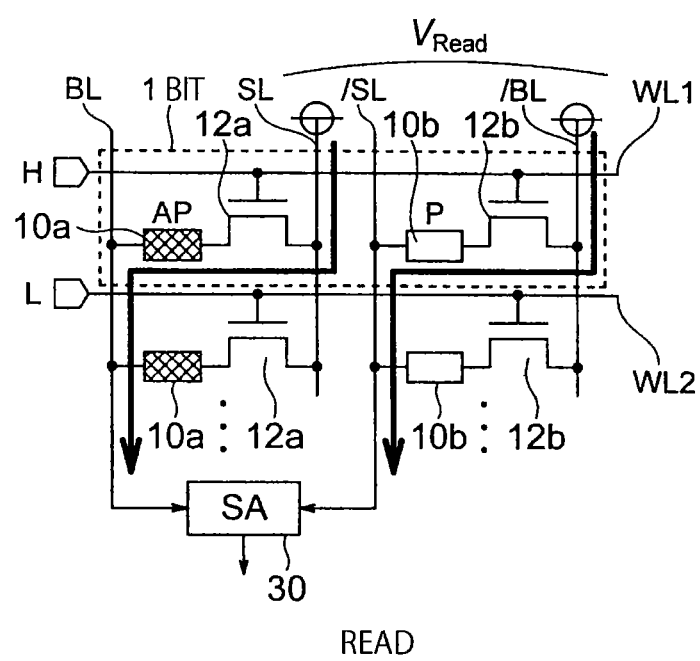
FIG. 16 is a diagram for explaining a read operation.

Next, the read operation of 2R-type memory cells will be described with reference to FIG. 16. It is assumed that the variable-resistance element 10a of the first cell connected to the word line WL1 is in a high-resistance state (AP state), and the variable-resistance element 10b of the second cell is in a low-resistance state. The word line WL1 is set to a selected state, i.e., "H" level, and the word line WL2 is set to a non-selected state, i.e., "L" level. A read potential $V_{Read}$ is applied to the read line SL and the bit line /BL, and a reference potential Vss is applied to the bit line BL and the read line /SL. As a result, a read current flows from the read line SL to the bit line BL through the selection transistor 12a and the variable-resistance element 10a of the first cell, and a read current flows from the bit line /BL to the read line /SL through the selection transistor 12b and the variable-resistance element 10b of the second cell. At this time, the current flowing through the bit line BL is compared with the current flowing through the read line /SL by a sense amplifier circuit 30 to sense that the data stored in the first cell is in a high-resistance state. The data stored in the first cell and the data stored in the second cell are complementary. Thus, it is sufficient that the data stored in only one of the first cell and the second cell is sensed.

Figure 17:
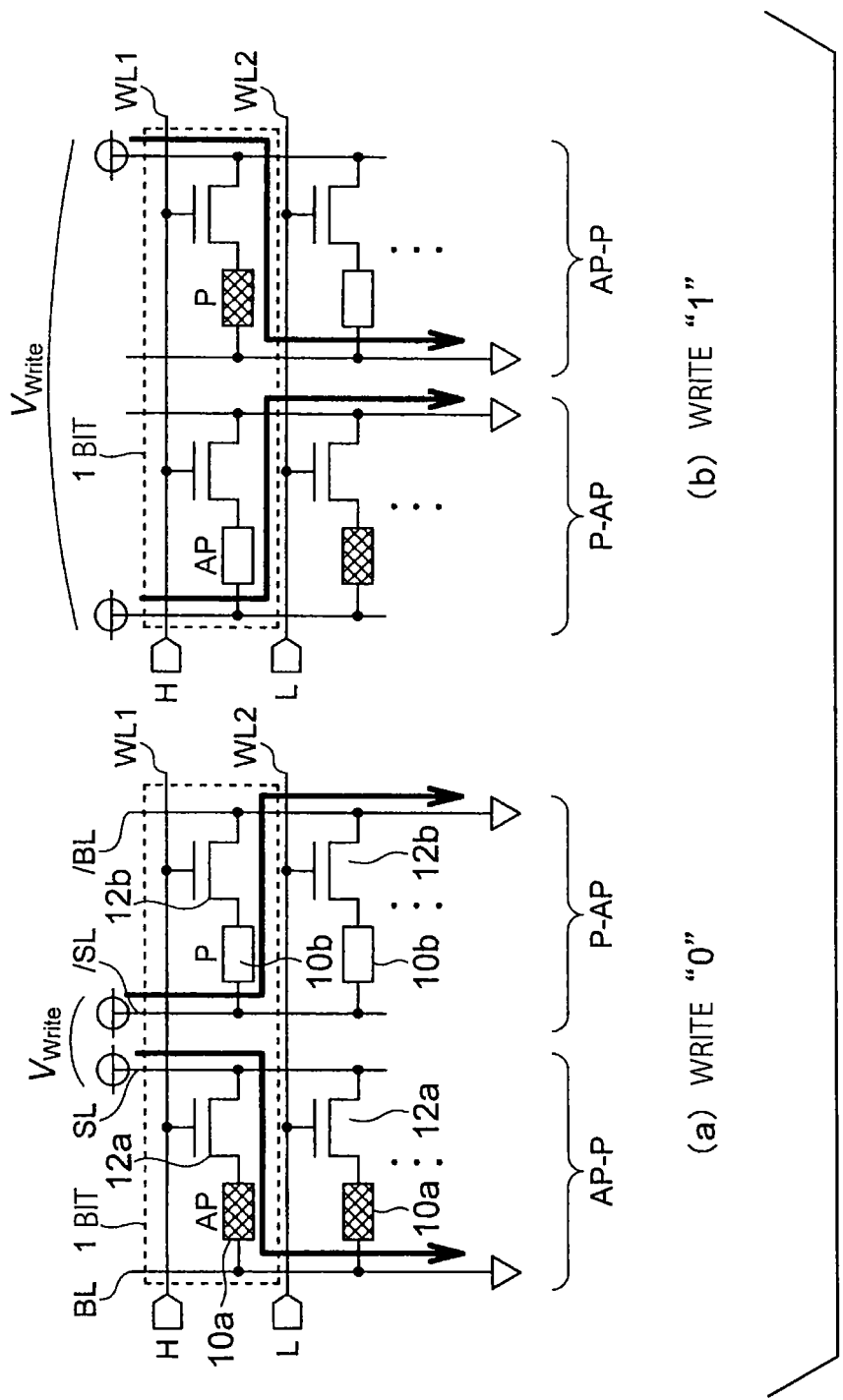
FIGS. 17(a) and 17(b) are diagrams for explaining write operations.

Next, a write operation of the 2R-type memory cell will be described with reference to FIGS. 17(a) and 17(b), which are for explaining writing operations for writing "0" and "1" data. FIG. 17(a) shows that the "0" data is written. When the variable-resistance element 10a of the first cell is in a high-resistance state (AP state) and the variable-resistance element 10b of the second cell is in a low-resistance state (P state), the variable-resistance element 10a of the first cell is brought into low-resistance state (P state) and the variable-resistance element 10b of the second cell is brought into the high-resistance state (AP state). First, the word line WL is set at an "H" level, and the word line WL2 is set at an "L" level. Thereafter, a write potential $V_{Write}$ is applied to the read line SL and the read line /SL, and a reference potential Vss is applied to the bit line BL and the bit line /BL. As a result, a write current flows from the read line SL to the bit line BL through the selection transistor 12a and the variable-resistance element 10a of the first cell to change the state of the variable-resistance element 10a in the first cell from the high-resistance state to the low-resistance state, and a write current flows from the read line /SL to the bit line /BL through the variable-resistance element 10b and the selection transistor 12b of the second cell to change the resistance state of the variable-resistance element 10b of the second cell from the low-resistance state to the high-resistance state.

FIG. 17(b) shows that the "1" data is written. When the variable-resistance element 10a of the first cell is in a low-resistance state (P state) and the variable-resistance element 10b of the second cell is in a high-resistance state (AP state), the variable-resistance element 10a of the first cell is brought into the high-resistance state (AP state) and the variable-resistance element 10b of the second cell is brought into the low-resistance state (P state). First, the word line WL is set at the "H" level, and the word line WL2 is set at the "L" level. Thereafter, a write potential $V_{Write}$ is applied to the bit line BL and the bit line /BL, and a reference potential Vss is applied to the read line SL and the read line /SL. As a result, a write current flows from the bit line BL to the read line SL through the variable-resistance element 10a and the selection transistor 12a of the first cell to change the state of the variable-resistance element 10a of the first cell from the low-resistance state to the high-resistance state, and a write current flows from the bit line /BL to the read line /SL through the selection transistor 12b and the variable-resistance element 10b of the second cell to change the state of the variable-resistance element 10b of the second cell from the high-resistance state to the low-resistance state.

Figure 18:
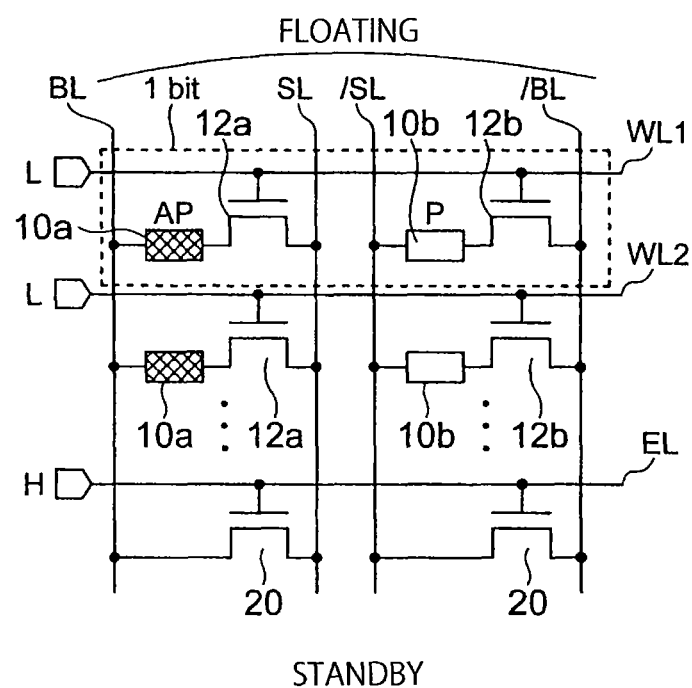
FIG. 18 is a diagram for explaining the case where an equalizer circuit is selected in a standby state.

FIG. 18 explains the state where an equalizer circuit 20 is selected in a standby state. In the standby state, the word lines WL1 and WL2 are set at an "L" level, the lines for control signal EL are set at an "H" level, and the equalizer circuit 20 is turned ON. At this time, the bit line BL, the read line SL, the read line /SL, and the bit line /BL are in a floating state.

As described above, according to this embodiment, a magnetic memory capable of reducing power consumption can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A magnetic memory comprising:
    a plurality of memory cells arranged in an array form, each memory cell including a first MTJ element having a first terminal and a second terminal, and a first selection unit including a third terminal, a fourth terminal, and a fifth terminal, the third terminal being connected to the first terminal of the first MTJ element, and selecting the first MTJ element based on a row selection signal;
    a pair of a first bit line and a second bit line provided to each column of the memory cells, the first bit line being connected to the second terminal of the first MTJ element of a memory cell in a corresponding column, and the second bit line being connected to the fourth terminal of the first selection unit of the memory cell of the corresponding column, the first bit line and the second bit line being selected by a column selection signal;
    a word line provided to each row of the memory cells, and connected to the fifth terminal of the first selection unit of each memory cell in the one of the rows to transmit the row selection signal to the first selection unit;

an equalizer circuit provided to each column of the memory cells, and to connect between the first bit line and the second bit line; and a control circuit that sets the first bit line and the second bit line connected to a selected memory cell to be a first and second potentials to conduct a write operation to the selected memory cell, and after the write operation, transmits a control signal to the equalizer circuit between the first bit line and the second bit line connected to the selected memory cell to activate the equalizer circuit to equalize the first and second potentials of the first bit line and the second bit line, thereby bringing into floating states.

2. The memory according to claim 1, wherein the equalizer circuit includes a second selection unit having a sixth terminal, a seventh terminal, and an eighth terminal, the six terminal being connected to the first bit line, the seventh terminal being connected to the second bit line, and the eighth terminal receiving the control signal.

3. The memory according to claim 2, wherein the equalizer circuit further includes a second MTJ element connected between the first bit line and the sixth terminal.

4. The memory according to claim 2, wherein each of the first selection unit and the second selection unit is an MOS transistor.

5. The memory according to claim 2, wherein each of the first selection unit and the second selection unit is a transfer gate.

6. The memory according to claim 1, wherein each memory cell further includes a second selection unit connected between the first bit line and the first MTJ element, the second selection unit having a sixth terminal, a seventh terminal, and an eighth terminal, the six terminal being connected to the first bit line, the seventh terminal being connected to the second terminal of the first MTJ element, and the eighth terminal being connected to the word line.

7. The memory according to claim 6, wherein each of the first selection unit and the second selection unit is an MOS transistor.

8. The memory according to claim 6, wherein each of the first selection unit and the second selection unit is a transfer gate.

9. The memory according to claim 1, wherein the control circuit sets the first bit line and the second bit line connected to a selected memory cell to be a third and fourth potentials to conduct a read operation to the selected memory cell, and after the read operation, the control circuit transmits the control signal to the equalizer circuit between the first bit line and the second bit line connected to the selected memory cell to activate the equalizer circuit to equalize the third and fourth potentials of the first bit line and the second bit line, thereby bringing into floating states.

* * * * *